United States Patent
Wicht et al.

(10) Patent No.: US 7,099,218 B2
(45) Date of Patent: Aug. 29, 2006

(54) DIFFERENTIAL CURRENT EVALUATION CIRCUIT AND SENSE AMPLIFIER CIRCUIT FOR EVALUATING A MEMORY STATE OF AN SRAM SEMICONDUCTOR MEMORY CELL

(75) Inventors: Bernhard Wicht, München (DE); Doris Schmitt-Landsiedel, Ottobrunn (DE); Jean-Yves Larguier, Antibes (FR)

(73) Assignee: Infineon Technologies AG, Munich (DE)

( * ) Notice: Subject to any disclaimer, the term of this patent is extended or adjusted under 35 U.S.C. 154(b) by 492 days.

(21) Appl. No.: 10/429,149

(22) Filed: May 2, 2003

(65) Prior Publication Data

US 2003/0218481 A1    Nov. 27, 2003

(30) Foreign Application Priority Data

May 2, 2002    (DE)    ................................ 102 19 649

(51) Int. Cl.
*G11C 7/02* (2006.01)
*G11C 7/00* (2006.01)
(52) U.S. Cl. .................. 365/207; 365/208; 365/230.08
(58) Field of Classification Search ................ 365/207, 365/208, 230.08, 205, 190
See application file for complete search history.

(56) References Cited

U.S. PATENT DOCUMENTS

| | | |
|---|---|---|
| 4,697,112 A | 9/1987 | Ohtani et al. |
| 5,015,891 A | 5/1991 | Choi |
| 5,162,681 A | 11/1992 | Lee |
| 5,253,137 A | 10/1993 | Seevinck |
| 5,710,736 A | 1/1998 | Masuda et al. |
| 5,828,614 A | 10/1998 | Gradinariu |
| 5,872,465 A | 2/1999 | Saitoh |
| 5,883,846 A * | 3/1999 | Lee ............................ 365/207 |
| 6,044,036 A * | 3/2000 | Flannagan et al. ..... 365/230.08 |
| 6,215,713 B1 * | 4/2001 | Austin ........................ 365/205 |

(Continued)

FOREIGN PATENT DOCUMENTS

DE    41 05 268    6/1992

(Continued)

OTHER PUBLICATIONS

H. Klar: "Integrierte Digitale Schaltungen MOS/BICOMS" [integrated digital circuits MOS/BICMOS], *Springer Verlag Berlin*, $2^{nd}$, Ed. 1996, pp. 178-183.

(Continued)

*Primary Examiner*—Richard Elms
(74) *Attorney, Agent, or Firm*—Laurence A. Greenberg; Werner H. Stemer; Ralph E. Locher

(57) ABSTRACT

A differential current evaluation circuit has a differential amplifier and a circuit for setting an input resistance of the current evaluation circuit. The circuit is connected to the outputs and the inputs of the differential amplifier and to signal lines. A sense amplifier circuit has a circuit section, in which a signal is available at an output in a temporally continuous manner even if, after the deactivation of the circuit connected upstream, a signal, in particular a signal supplied by the current evaluation circuit, is no longer present at its input. The differential current evaluation circuit and the sense amplifier circuit are disposed in a circuit configuration for reading out and evaluating a memory state of a semiconductor memory cell. The current evaluation circuit can be activated by a circuit section for automatic deactivation before a read operation and be automatically deactivated directly after the read operation has ended.

27 Claims, 7 Drawing Sheets

U.S. PATENT DOCUMENTS

| | | | |
|---|---|---|---|
| 6,282,138 B1 * | 8/2001 | Wilkins | 365/207 |
| 6,317,374 B1 | 11/2001 | Feurle | |
| 6,466,500 B1 | 10/2002 | Wicht et al. | |
| 2001/0043119 A1 | 11/2001 | Wicht et al. | |
| 2003/0063496 A1 | 4/2003 | Baglin et al. | |
| 2005/0117424 A1 * | 6/2005 | Sung | 365/205 |

FOREIGN PATENT DOCUMENTS

| | | |
|---|---|---|
| DE | 199 61 518 A1 | 7/2001 |
| DE | 100 22 263 A1 | 11/2001 |
| DE | 100 23 362 A1 | 11/2001 |
| EP | 0 748 042 A1 | 12/1996 |
| EP | 0 827 151 A1 | 3/1998 |
| JP | 03-016092 | 1/1991 |
| JP | 04-032096 | 2/1992 |
| JP | 09-223957 | 8/1997 |
| JP | 10-031893 | 2/1998 |
| JP | 10-289586 | 10/1998 |

OTHER PUBLICATIONS

Nobutaro Shibata: "Current Sense Amplifiers for Low-Voltage Memories", *IEICE Trans. Electron.*, vol. E79-C, No. 8, Aug. 1996, pp. 1120-1130.

Borivoje Nikolic et al.: "Improved Sense-Amplifier-Based Flip-Flop: Design and Measurements", *IEEE Journal of Solid-State Circuits*, vol. 35, No. 6, Jun. 2000, pp. 876-884.

* cited by examiner

DIFFERENTIAL CURRENT EVALUATION CIRCUIT AND SENSE AMPLIFIER CIRCUIT FOR EVALUATING A MEMORY STATE OF AN SRAM SEMICONDUCTOR MEMORY CELL

BACKGROUND OF THE INVENTION

Field of the Invention

The invention relates to a differential current evaluation circuit used in particular in a semiconductor memory device. Furthermore, the invention relates to a sense amplifier circuit for evaluating a voltage difference between signal lines, in particular for reading out and evaluating the voltage difference between two signal lines that are connected to a semiconductor memory cell.

Semiconductor memory cells, such as static memories (SRAMs) for example, are used in many cases in integrated circuits. SRAMs are both produced as individual modules and integrated in addition to other components on a chip. The area proportion of SRAMs in microprocessors and in other highly complex logic circuits is up to 50%. Therefore, a careful configuration of the SRAM and of the peripheral circuits is of great importance in many applications. An SRAM is a random access read/write memory. The term static memory is used since the electrically written information can be stored without limitation as long as the supply voltage is not switched off. A known SRAM memory cell contains two feedback CMOS inverters that are connected to the two complementary bit lines via two NMOS selection transistors. The use of complementary bit lines increases the reliability and reduces the sensitivity to fluctuations in component characteristic quantities. FIG. 1 shows a known circuit configuration for reading out and evaluating a memory state in a semiconductor memory cell, in particular an SRAM memory cell. The memory cells Z are connected to one another via a bit line pair BL and BLB. If a memory cell Z to be read is selected via a non-illustrated word line, a current $i_c$ flows from the bit line into the memory cell Z on that side at which a logic state "0", for example, is stored. On the opposite side of the memory cell Z, at which a complementary signal is present, generally no usable current flows owing to the weak p-channel transistor in the traditional 6-transistor memory cell.

Owing to the capacitances and resistances per unit length of the word lines and of the bit lines BL and BLB, the memory cell blocks cannot contain an arbitrary number of memory cells Z for a given access time. The smaller the memory cell blocks are kept, the shorter the access times obtained. However, since each cell block requires peripheral circuits, decoding circuits, word line drivers and evaluation circuits, this results in that the chip area becomes larger and the ratio of area occupied by the peripheral logic to the area of the cell arrays becomes less favorable. Owing to the high number of memory cells Z connected to the bit lines BL and BLB, the bit lines BL and BLB have a high capacitance $C_{BL}$ per unit length. In order not to have to configure an evaluation stage with a downstream driver stage for each memory cell column, use is made of a bit line multiplexer which is controlled by corresponding signals for column selection. When reading out the memory state of the memory cell Z, the capacitor $C_{BL}$ is discharged by the memory cell current $i_c$. The resulting voltage swing $\Delta V_{BL}$ is evaluated by a sense amplifier LV connected downstream and is output as a logic signal "0" or "1". The voltage swing $\Delta V_{BL}$ corresponds to the voltage difference between the bit lines BL and BLB.

The access time and the tolerance insensitivity of the memory cell array Z are significantly determined by the evaluation circuit for reading out and evaluating the memory state of the memory cell Z. Since the SRAM memory cell retains the stored information even during a read operation, the sense amplifier LV in accordance with FIG. 2 may be used, for example, as the evaluation circuit. The known sense amplifier LV is a so-called latch-type sense amplifier containing, as essential element, two cross-coupled inverters which allow a fast mode of operation through positive feedback. Besides the cross-coupled inverters, a first circuit section of the sense amplifier LV has two p-channel transistors M1 and M6 connected in parallel with the p-channel transistors M2 and M5, respectively. The first circuit section is connected to two outputs SO and SON of the sense amplifier LV. Furthermore, the transistors M1 and M6 are electrically connected, by their gate terminals, to an input SAEN at which the signal for activating an evaluation operation of the sense amplifier LV is applied. A second circuit section of the sense amplifier LV has the n-channel transistors M4 and M8, the gate terminal of the transistor M4 being electrically connected to a first input INN of the sense amplifier LV and the gate terminal of the transistor M8 being electrically connected to a second input INP of the sense amplifier LV. Furthermore, the sense amplifier LV has an n-channel transistor M9, which is connected to the two transistors M4 and M8 on one side and to a ground potential on the other side. The transistor M9 is connected to the input SAEN by its gate terminal. Only when there is a sufficiently large voltage difference between the inputs INN and INP is the sense amplifier LV activated by the signal present at the input SAEN.

In order that the sense amplifier LV carries out a correct evaluation even in the event of production-dictated asymmetries (mismatch), the voltage swing $\Delta V_{BL}$ must not be too small (typically $\Delta V_{BL} > 100$ mV). By way of example, a differential amplifier with current mirror load, as is disclosed in U.S. Pat. No. 4,697,112, may also be used as the sense amplifier LV.

A differential sense amplifier circuit is disclosed in German Patent DE 41 05 268 C2. This differential sense amplifier circuit has two input inverters having at least in each case two series-connected complementary transistors, the outputs of the inverters being connected to a data line pair for outputting the amplified voltage difference that is detected at the inputs. The sense amplifier circuit has a latching circuit that contains complementary transistors and is connected between the data line pair in such a way that it amplifies the voltage difference between the output terminals of the two input inverters. The input terminals of the input inverters are connected to the gate terminals of only one respective transistor of the series-connected complementary transistors. The output terminals of the input inverters are in each case connected to the gate terminals of the other series-connected complementary transistors.

In the known embodiments of the circuit configuration, the time duration for reading out and evaluating the memory state of the SRAM memory cell is relatively long since the charge reversal of the bit line capacitance $C_{BL}$ proceeds relatively slowly. Moreover, in modern semiconductor technologies, the nonreactive resistance and the inductance of the bit lines have an increasingly disadvantageous effect on the reading speed. Therefore, the circuit configuration is slow during the read-out in particular of large memory cell configuration (bit line capacitance $C_{BL}$ relatively high) and low supply voltages $V_{DD}$ (memory cell current $i_c$ relatively low).

An improvement in the operation of reading out and evaluating a memory state in an SRAM memory cell can be achieved by directly evaluating the currents that flow via the transistors of the memory cell Z, rather than the voltage difference. The charge reversal of the bit lines BL and BLB can thus be avoided. Such a concept is illustrated in FIG. 3. A current evaluation circuit SBSA is connected upstream of the known sense amplifier LV. The currents $i_{BL}$ and $i_{BLB}$ that flow through the bit lines BL and BLB are present at two inputs of the current evaluation circuit SBSA. An embodiment of such a current evaluation circuit SBSA is disclosed in the reference by Klar, H., titled "Integrierte Digitale Schaltungen MOS/BICMOS" ["Integrated Digital Circuits MOS/BICMOS"], 2nd edition, Springer-Verlag Berlin 1996, and is shown in FIG. 4. The current evaluation circuit SBSA is constructed from two current amplifiers SV1 and SV2. The first current amplifier SV1 has the p-channel transistors T1 and T3 and the second current amplifier SV2 has the p-channel transistors T2 and T4. The diode-connected transistors T3 and T4 are connected to data lines DL and DLB, respectively, which are held at a potential of approximately a threshold voltage above ground by further non-illustrated circuits. What is intended to be achieved by the current evaluation circuit SBSA is that, during a read operation, the potentials $V_{C1}$ and $V_{C2}$ of the two bit lines BL and BLB are kept identical and constant and the current $i_c$ which flows into the selected memory cell Z can be measured. In a precharge phase, a terminal y is connected to a supply voltage potential $V_{DD}$, as a result of which the transistors T3 and T4 are in the off state. The two bit lines BL and BLB are charged to a potential of $V_{DD-VT}$. The voltage $V_T$ is the threshold voltage of the transistors T3 and T4.

The current evaluation circuit SBSA is activated by connecting the signal y to a ground potential. The memory cell Z is not yet selected in this state. The transistors T1 to T4 are in the saturation region and conduct current supplied by the precharge transistors T5 and T6. If the transistors T1 to T4 of the current evaluation circuit SBSA are dimensioned with high resistance and the precharge transistors T5 and T6 with low resistance, the change in potential of the bit lines BL and BLB is relatively small. If the memory cell Z is then selected by a non-illustrated word line, a current $i_c$, as is depicted for example in FIG. 4, flows into the memory cell Z on account of the stored information. This has the effect that different currents flow in the two current amplifiers SV1 and SV2 or in the two circuit branches of the current evaluation circuit SBSA. Since only relatively small changes in potential occur in the current evaluation circuit SBSA, the transistors T1 to T4 remain in the saturation region. On account of the series circuit, the transistors T1 and T3 of the first current amplifier SV1 have identical gate-source voltages $V_1$. The same applies correspondingly to the transistors T2 and T4 of the second current amplifier SV2, these two transistors having gate-source voltages $V_2$. Since the control terminal y is at ground potential and the transistors T1 and T2 are cross-coupled, the following equations apply to the voltages $V_{C1}$ and $V_{C2}$ of the two bit lines BL and BLB:

$$V_{C1}=V_2+V_1$$

$$V_{C2}=V_1+V_2.$$

The bit line potentials $V_{C1}$ and $V_{C2}$ are identical independently of the current distribution in the current evaluation circuit SBSA. A so-called virtual short circuit forms between the nodes A and B, as a result of which the drain currents of the transistors T5 and T6 are likewise of identical magnitude. Since the memory cell Z draws current, a larger current flows in the transistors T2 and T4 than in the transistors T1 and T3. The difference between the drain currents of T3 and T4 is identical to the current $i_c$ which flows into the memory cell Z. Despite the different currents in the two branches of the current evaluation circuit SBSA, the voltages $V_{C1}$ and $V_{C2}$ are of identical magnitude and constant during the read operation. This is brought about by a feedback mechanism. First, with the activation of the memory cell Z, the current in the transistors T1 and T3 decreases in this case, while the current in the second current amplifier SV2 is unchanged. The sum of the gate-source voltages $V_1+V_2$ decreases. This would reduce the potential of the node B on account of the virtual short circuit mentioned. The consequence is that the precharge transistor T6 conducts a larger current, which brings about a larger gate-source voltage $V_2$ and thus counteracts the cause, the reduction of the sum of $V_1+V_2$. The bit line potentials $V_{C1}$ and $V_{C2}$ are of identical magnitude and constant during the read operation. The bit line capacitances $C_{BL}$ do not have to be subjected to charge reversal. Such a circuit is also disclosed in U.S. Pat. No. 5,253,137.

One possibility for further processing the output signals of the current evaluation circuit SBSA is based on connecting the drain terminals of the transistors T3 and T4 to ground potential and passing the potentials of the nodes I and II to the inputs of the sense amplifier circuit LV connected downstream.

Such embodiments are disclosed in the reference by Nobutaro Shibata, titled "Current Sense Amplifiers for Low-Voltage Memories", IEICE Trans. Electron., Vol. E79-C, No. 8, pp. 1120–1130, August 1996. The current evaluation circuit, constructed in accordance with the current evaluation circuit SBSA in FIG. 4, has resistors R1 and R2 instead of the transistors T3 and T4. In a first exemplary embodiment, the sense amplifier connected downstream is configured as a current mirror type and thus as a static differential stage. In a second exemplary embodiment, the sense amplifier connected downstream is merely constructed from simple inverters. The relatively high power consumption and also the relatively large area requirement are disadvantageous in the case of the known current evaluation circuits, in particular in the embodiments with two simple current amplifiers, and the known sense amplifiers. Furthermore, the time duration for reading out and evaluating a stored state in a memory cell is relatively long and the robustness of the known circuit configurations with respect to production tolerances (mismatch, etc.) is relatively low.

SUMMARY OF THE INVENTION

It is accordingly an object of the invention to provide a differential current evaluation circuit and a sense amplifier circuit for evaluating a memory state of an SRAM semiconductor memory cell that overcomes the above-mentioned disadvantages of the prior art devices of this general type, which provides an improved circuit configuration for reading out and evaluating a memory state in a semiconductor memory cell, in particular an SRAM memory cell.

With the foregoing and other objects in view there is provided, in accordance with the invention, a differential current evaluation circuit for connecting to a data line pair having a first signal line and a second signal line. The differential current evaluation circuit contains a differential amplifier having a first output, a second output, a first input functioning as a first input of the differential current evaluation circuit and electrically connected to the first signal line of the data line pair, and a second input functioning as a second input of the differential current evaluation circuit and electrically connected to the second signal line of the data line pair. A circuit is provided for setting an input resistance of the differential current evaluation circuit. The circuit is electrically connected to the first and second outputs and the first and second inputs of the differential amplifier and to the first and second signal lines of the data line pair.

In particular, it is an object to provide a current evaluation circuit which enables a faster read-out and evaluation of a signal difference occurring between two lines, in particular during an operation of reading a memory state in a semiconductor memory cell connected to signal lines and also has a reduced area requirement.

Furthermore, it is an object of the invention to provide a sense amplifier circuit with which a voltage difference between two signal lines, which is generated in particular as a result of a read operation for reading out a stored item of information of a memory cell connected to the signal lines, can be evaluated in a simple manner and with which the information read can be provided at the output of the sense amplifier independently of the state of circuit sections connected upstream.

Furthermore, it is an object to provide a circuit configuration containing a semiconductor memory cell, in particular an SRAM memory cell, a current evaluation circuit and sense amplifier, which circuit configuration has a relatively low power consumption and fast and improved signal processing.

In a first aspect of the invention, the object is achieved by a current evaluation circuit embodied in differential fashion. The current evaluation circuit has a differential amplifier having a first input, which forms a first input of the differential current evaluation circuit. The first input of the differential amplifier is electrically connected to a first signal line of a data line pair. The differential amplifier has a second input, which is a second input of the differential current evaluation circuit, the second input being electrically connected to a second signal line of the data line pair. For setting an input resistance of the current evaluation circuit, the differential current evaluation circuit has a circuit or means which is/are electrically connected to outputs and the inputs of the differential amplifier and to the signal lines of the data line pair.

A difference in the current flowing in two signal lines, in particular complementary signal lines, can be determined rapidly with the differential current evaluation circuit according to the invention. Furthermore, the relatively simple construction makes it possible to provide a current evaluation circuit which has a reduced area requirement in particular compared with the use of two separate current evaluation circuits with only one input.

In a preferred exemplary embodiment, the circuit/means for setting the input resistance are embodied by two transistors of a first conductivity type. A first transistor is electrically connected to a first output and the first input of the differential amplifier and to the first signal line. A second transistor is electrically connected to a second output of the differential amplifier and the second signal line. It is advantageous if the first transistor is connected to the first output of the differential amplifier by its gate terminal, to the ground potential by a second terminal and to the first signal line of the data line pair by a first terminal, this connection advantageously being realized via a first circuit node to which the first input of the differential amplifier is electrically connected. The second transistor is electrically connected to the second output of the differential amplifier by its gate terminal, to the ground potential by a second terminal and to the second signal line of the data line pair by a first terminal. The connection advantageously being realized via a second circuit node to which the second input of the differential amplifier is electrically connected.

As a result, it is possible to achieve a particularly fast mode of operation of the current evaluation circuit. The differential amplifier advantageously has two circuit branches connected in parallel, a transistor of a first conductivity type and a transistor of a second conductivity type being connected in series in each of the two circuit branches. Preferably, the two circuit branches are in each case connected to a supply voltage potential by one end and are electrically connected, by the respective other end, to a first terminal of a transistor having the first conductivity type, which transistor is connected in series with the circuit branches. It may be provided that the transistor of the first conductivity type in the first circuit branch is electrically connected to the second input of the differential amplifier by its gate terminal and the transistor of the first conductivity type in the second circuit branch is electrically connected to the first input of the differential amplifier by its gate terminal.

In an advantageous manner, the differential current evaluation circuit is supplemented by a circuit section for setting the operating point of the differential amplifier. The circuit section has at least two electrical connections to the differential amplifier. A preferred exemplary embodiment of the circuit section for setting the operating point is characterized in that a first transistor of the second conductivity type is electrically connected by its gate terminal to a first and a second circuit branch of the differential amplifier, in particular to the gate terminal of a transistor of a second conductivity type in the first circuit branch and the gate terminal of a transistor of a second conductivity type in the second circuit branch. It may be provided that the circuit section for setting the operating point has a second transistor of the second conductivity type, whose gate terminal is electrically connected to a third input of the current evaluation circuit.

An advantageous exemplary embodiment of the circuit section for setting the operating point of the differential amplifier has a transistor of the first conductivity type, whose gate terminal is electrically connected to the gate terminal of a transistor of a first conductivity type of the differential amplifier, the transistor of the differential amplifier being connected in series with the circuit branches of the differential amplifier.

Further advantageous refinements of the circuit section for setting the operating point of the differential amplifier in the differential current evaluation circuit are specified in the subclaims.

A particularly preferred embodiment of the differential current evaluation circuit is characterized by a circuit section for deactivating the differential amplifier. The circuit section has at least electrical connections to the outputs of the differential amplifier and to a third and a fourth input of the current evaluation circuit. It is advantageous if the circuit section additionally has electrical connections to a first and a second circuit branch of the differential amplifier. By virtue of the circuit section for deactivating the differential amplifier, the differential current evaluation circuit has a relatively low power consumption. Particularly if the differential current evaluation circuit is used for reading out a memory state in a semiconductor memory cell, in particular an SRAM memory cell, the differential amplifier or the entire differential current evaluation circuit can thus be switched off directly after the end of a read operation and the power consumption can thus be considerably reduced.

A preferred exemplary embodiment of the circuit section for deactivating the differential amplifier has a first transistor of the first conductivity type, which is connected to the first output of the differential amplifier and to the third input of the current evaluation circuit. At least one second transistor of the first conductivity type is connected to the second output of the differential amplifier and to the third input of the current evaluation circuit. Moreover, the circuit section for deactivation has two transistors of the second conductivity type, one being electrically connected to the third input of the current evaluation circuit by its gate terminal and the other being electrically connected to the fourth input of the current evaluation circuit. Provision may be made for connecting the two transistors of the first conductivity type to the third input of the current evaluation circuit by their gate terminals and to ground potential by in each case the first terminals. Moreover, the first transistor of the first conductivity type is electrically connected to the first output of the differential amplifier by a second terminal and the second transistor of the first conductivity type is electrically connected to the second output of the differential amplifier by a second terminal.

The second transistor of the second conductivity type of the circuit section for deactivating the differential amplifier is advantageously electrically connected to the fourth input of the current evaluation circuit by its gate terminal, to the supply voltage potential by a first terminal and to the two circuit branches by a second terminal. In particular, the second transistor of the second conductivity type is electrically connected to gate terminals of transistors of a second conductivity type, a respective one of which is disposed in one of the circuit branches of the differential amplifier.

In a particularly advantageous manner, the circuit sections for setting the operating point and for deactivating the differential amplifier are connected up in such a way that they have at least one common component which is assigned to both circuit sections. In particular, the component is characterized by the second transistor of the second conductivity type in the circuit section for setting the operating point and by the first transistor of the second conductivity type in the circuit section for deactivating the differential amplifier. As a result of one or a plurality of components being assigned to the two circuit sections, it is possible to reduce the number of components required for performing these functions—setting the operating point and deactivating the differential amplifier or the differential current evaluation circuit. As a result, the differential current evaluation circuit can be realized with a reduced outlay on circuitry and, moreover, with a reduced area requirement.

The differential current evaluation circuit may preferably be supplemented by a further circuit section, which serves for activating the differential amplifier or the entire differential current evaluation circuit. The circuit section for activation is electrically connected to the two outputs of the differential amplifier and to a fifth and a sixth input of the current evaluation circuit. It may be provided that this circuit section for activating the differential amplifier has at least two transistors of a first conductivity type and advantageously at least two transistors of a second conductivity type. An advantageous circuit configuration of these four transistors in the circuit section for activating the differential current evaluation circuit is specified in the subclaims.

A further aspect of the invention considers a sense amplifier circuit, in particular a sense amplifier circuit for evaluating a voltage difference between two data lines, in particular complementary data lines, to which a semiconductor memory cell, in particular an SRAM memory cell, is connected. The sense amplifier circuit has a first circuit section, which accordingly corresponds to the first circuit section of the sense amplifier circuit illustrated from the prior art shown in FIG. 2. The sense amplifier circuit according to the invention additionally has a second circuit section, which is characterized by two circuit branches each having two transistors. The two transistors in the two circuit branches are in each case connected in parallel. Preferably, all four transistors of the two circuit branches are of a first conductivity type. It may be provided that the first transistor in the first circuit branch is electrically connected to a first input of the sense amplifier circuit by its gate terminal and the second transistor of the first circuit branch is electrically connected to a third input of the sense amplifier circuit by its gate terminal. The first transistor of the second circuit branch is electrically connected to a fourth input of the sense amplifier circuit by its gate terminal and the second transistor of the second circuit branch is electrically connected to the third input of the sense amplifier circuit by its gate terminal. The two circuit branches are electrically connected to a transistor of the first conductivity type, which is disposed in the second circuit section of the sense amplifier, and whose gate terminal is connected to the third input of the sense amplifier. Furthermore, the two circuit branches of the second circuit section have two electrical connections to the first circuit section of the sense amplifier.

By use of the sense amplifier circuit according to the invention, an item of information read from a circuit configuration connected upstream of the sense amplifier circuit can be made available permanently at the output of the sense amplifier circuit. This can be ensured independently of the operating state or circuit state of the circuit configuration connected upstream of the sense amplifier circuit. In particular, this is possible when a current evaluation circuit connected upstream of the sense amplifier circuit is deactivated.

Furthermore, the invention considers a circuit configuration for reading out and evaluating a memory state of a semiconductor memory cell, in particular of an SRAM memory cell, the semiconductor memory cell being electrically connected to a first data line of a data line pair by one terminal and to a second data line of the data line pair by a second terminal. The circuit configuration has a differential current evaluation circuit according to the invention.

Furthermore, the circuit configuration has a sense amplifier circuit connected downstream of the differential current evaluation circuit. Provision may be made for connecting up a sense amplifier circuit according to the invention as a sense amplifier circuit in the circuit configuration. However, it is also possible, by way of example, to use a sense amplifier circuit or a sense amplifier as is disclosed in FIG. 2, for example.

Furthermore, the invention considers a circuit configuration for reading out and evaluating a memory state of a semiconductor memory cell, in particular of an SRAM memory cell, the semiconductor memory cell being electrically connected to a first data line of a data line pair by one terminal and to a second data line of the data line pair by a second terminal, the circuit configuration having a current evaluation circuit, in particular having a circuit or means for deactivating the current evaluation circuit, in particular a differential current evaluation circuit. Furthermore, the circuit configuration has a sense amplifier circuit according to the invention which is connected downstream of the current evaluation circuit. In an advantageous exemplary embodiment, the current evaluation circuit is configured in accordance with the differential current evaluation circuit according to the invention.

A particularly preferred embodiment of a circuit configuration having a semiconductor memory cell, a current evaluation circuit and a sense amplifier circuit is distinguished by the fact that the circuit configuration has a circuit section for automatically deactivating the current evaluation circuit after a read operation. The circuit section for automatically deactivating the current evaluation circuit is electrically connected at least to an input of the current evaluation circuit and at least to an output of the sense amplifier circuit. In the case of a combination of a differential current evaluation circuit according to the invention and a sense amplifier circuit according to the invention, it is advantageous to electrically connect the circuit section for automatically deactivating the current evaluation circuit to the two outputs and the third input of the sense amplifier circuit and to the third and fourth inputs of the current evaluation circuit.

The third circuit section for automatically deactivating the current evaluation circuit advantageously has a series circuit containing a NAND gate, an inverter and a flip-flop. In a preferred exemplary embodiment, the inputs of the NAND gate are connected to the two outputs of the sense amplifier circuit. An output of the flip-flop is electrically connected to the fourth input of the current evaluation circuit and an inverting output of the flip-flop is electrically connected to the third input of the current evaluation circuit and the fourth input of the sense amplifier circuit. The circuit section for automatic deactivation makes it possible to achieve a further improvement with regard to the power consumption of the circuit configuration and the reduction of the time duration for reading out and evaluating a memory state in the SRAM memory cell.

Other features which are considered as characteristic for the invention are set forth in the appended claims.

Although the invention is illustrated and described herein as embodied in a differential current evaluation circuit and a sense amplifier circuit for evaluating a memory state of an SRAM semiconductor memory cell, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 2:
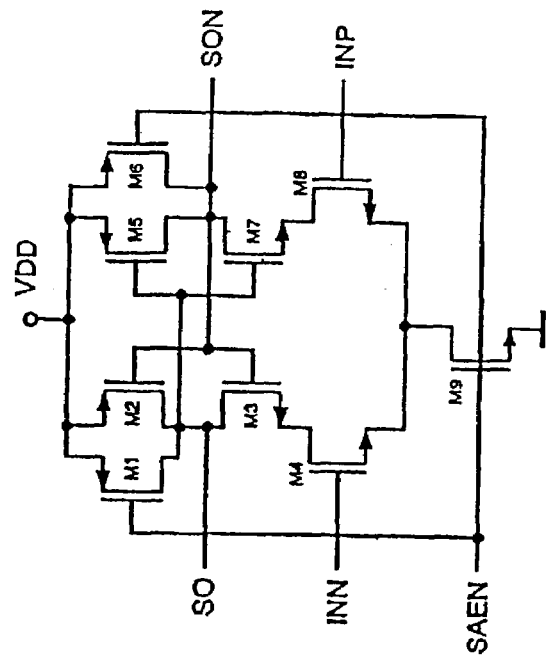
FIG. 2 is a circuit diagram of the sense amplifier circuit according to the prior art.
Figure 1:
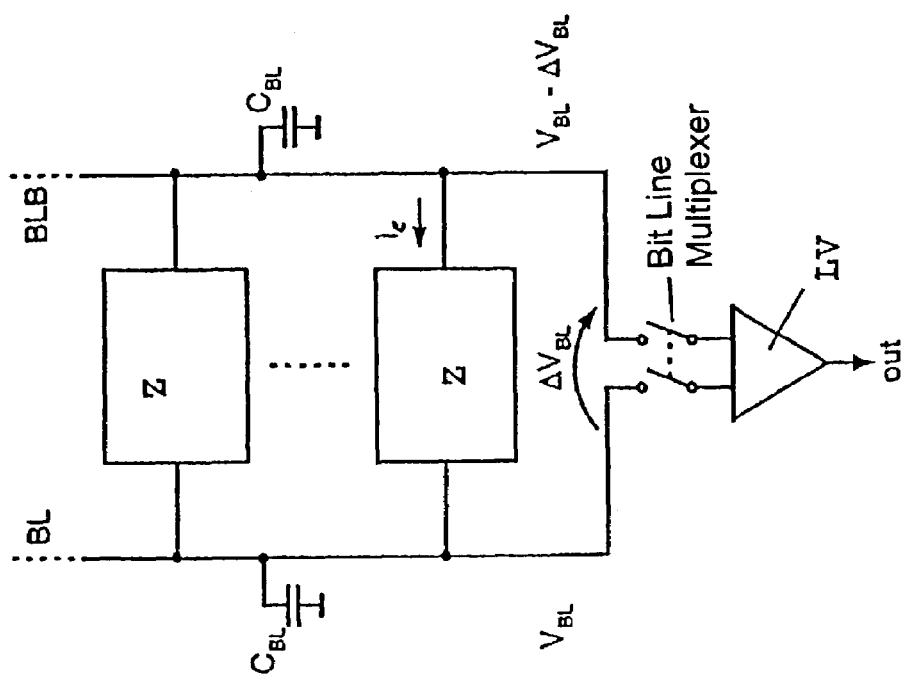
FIG. 1 is block circuit diagram of a configuration of memory cells and a sense amplifier circuit according to the prior art.

In all the figures of the drawing, sub-features and integral parts that correspond to one another bear the same reference symbol in each case. Referring now to the figures of the drawing in detail and first, particularly, to FIG. 5 thereof, there is shown a differential current evaluation circuit SBS according to the invention. The differential current evaluation circuit SBS has a differential amplifier DV, whose first input inp is electrically connected to a first bit line BL of a bit line pair. A second input inn of the differential amplifier DV is electrically connected to a second bit line BLB of the bit line pair. The two inputs inp and inn are at the same time the first and, respectively, the second input of the differential current evaluation circuit SBS. A first output outp of the differential amplifier DV, which is a first output of the current evaluation circuit SBS, is connected to a gate terminal of a transistor MIN, embodied as an n-channel transistor in the exemplary embodiment. The transistor MIN is electrically connected to a ground potential by its source terminal and, by its drain terminal, to the first bit line BL and the first input inp of the differential amplifier DV via a first circuit node SK1. A second output outn of the differential amplifier DV, which is a second output of the differential current evaluation circuit SBS, is electrically connected to a gate terminal of a transistor MINB, embodied as an n-channel transistor in the exemplary embodiment. The transistor MINB is connected to the ground potential by its source terminal and, by its drain terminal, to the second bit line BLB and to the second input inn of the differential amplifier DV via a second circuit node SK2.

A memory cell, which is embodied as an SRAM memory cell in the exemplary embodiment, has a first connection to the bit line BL and a second connection to the second bit line BLB. An operating point current $I_B$ is set on the bit lines BL and BLB by the transistors ML and MLB, embodied as p-channel transistors in the exemplary embodiment. The operating point current $I_B$ flows through the input transistors MIN and MINB of the differential current evaluation circuit SBS. The voltage differential amplifier DV detects the voltage difference between the two bit lines BL and BLB. During a read operation, the operating point current $I_B$ is reduced by a memory cell current $i_c$ depending on a stored state (logic state "0" or logic state "1") on one side. This slightly reduces the voltage on the affected bit line, the voltage on the bit line BLB in the exemplary embodiment. This also reduces the voltage at the input inn of the differential amplifier DV. The feedback of the outputs outp and outn of the differential amplifier DV via the two transistors MIN and MINB generates the setting of a small input resistance for a current detection at the inputs of the current evaluation circuit SBS and corrects the change in voltage on the bit line BLB toward the value 0. By way of example, if a logic state "0" is read on the bit line BLB, then the feedback mechanism acts as follows. The operating point current $I_B$ is reduced by the memory cell current $i_c$ in the bit line BLB, resulting in a decrease in the voltage at the input inn of the differential amplifier DV. As a consequence of this, the output voltage at the second output outn of the differential amplifier DV decreases, and thus so does the gate voltage of the transistor MINB. This causes the current $i_{outn}$ to decrease. The decrease in the current $i_{outn}$ counteracts a reduction of the voltage in the bit line BLB. At the same time, the voltage at the first output outp of the differential amplifier DV rises. The voltage difference $\Delta V$ generated at the outputs outp and outn of the differential amplifier DV or the differential current evaluation circuit SBS is a measure of the memory cell current $i_c$ and of the stored information in the memory cell Z and can be evaluated by a non-illustrated sense amplifier connected downstream.

The differential amplifier DV has a first circuit branch SZW1 (FIG. 6) and a second circuit branch SZW2. The first circuit branch SZW1 has a transistor MLP, embodied as a p-channel transistor in the exemplary embodiment, which is connected to a supply voltage potential $V_{DD}$ by its source terminal and, by its drain terminal, to the drain terminal of a transistor MINN, embodied as an n-channel transistor in the exemplary embodiment. The transistor MINN is electrically connected to the second input inn of the differential amplifier DV by its gate terminal. Furthermore, the drain terminals of the transistors MLP and MINN are electrically connected to the first output outp of the differential amplifier DV. The second circuit branch SZW2 has a p-channel transistor MLN and an n-channel transistor MINP. The drain terminals of the transistors MLN and MINP are connected to the second output outn of the differential amplifier DV. The transistor MINP is electrically connected to the first input inp of the differential amplifier DV via its gate terminal. The second circuit branch SZW2 is connected to the supply voltage potential $V_{DD}$ via a source terminal of the transistor MLN. The two circuit branches SZW1 and SZW2 are electrically connected to the drain terminal of the downstream-connected n-channel transistor MB1 via the source terminals of the transistors MINN and MINP.

Figure 5:
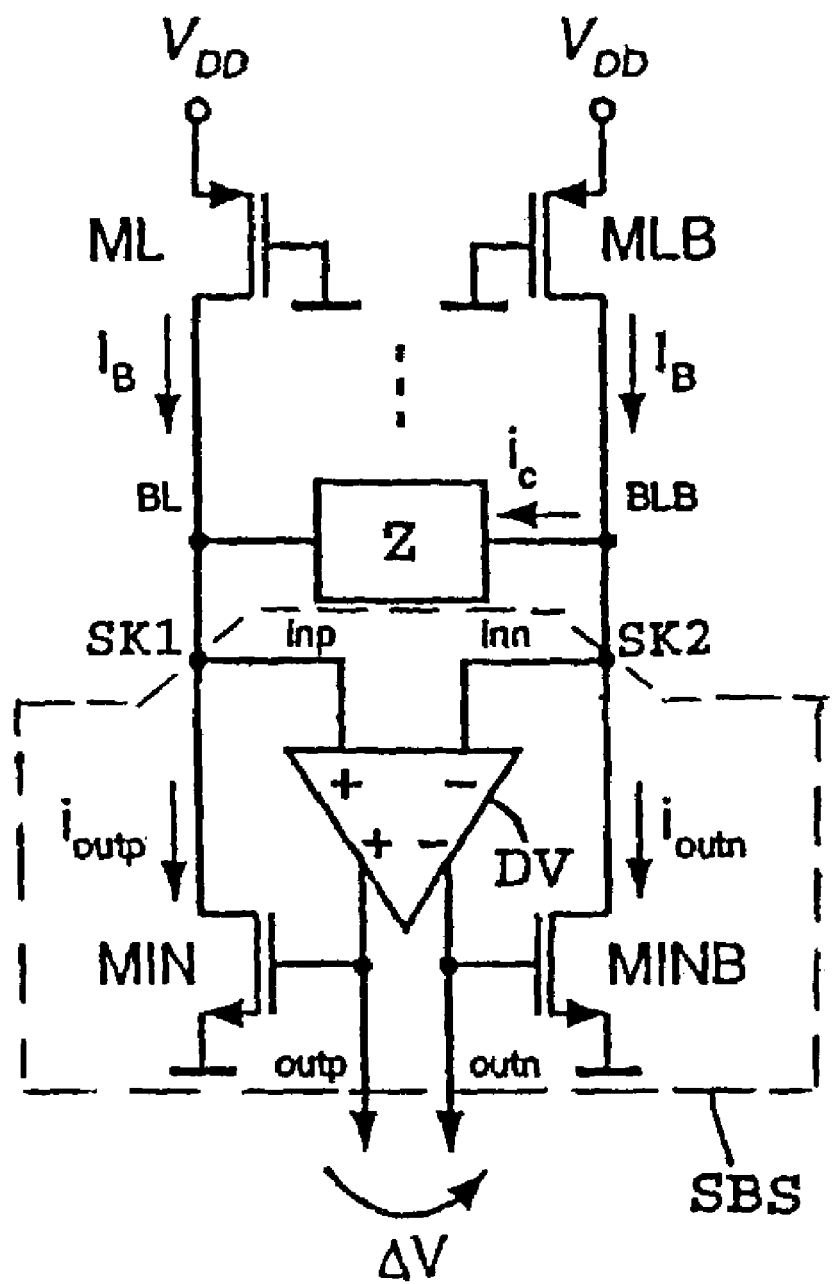
FIG. 5 is a circuit diagram of a first illustration of the current evaluation circuit according to the invention.

The differential amplifier DV is advantageously extended by a circuit section SAP for setting the operating point of the differential amplifier DV, by a circuit section STD for deactivating the differential amplifier DV or the entire differential current evaluation circuit SBS (FIG. 5) and by a circuit section STA for activating the differential amplifier DV or the differential current evaluation circuit SBS. In the exemplary embodiment, the circuit section SAP for setting the operating point has an n-channel transistor MB2 and two p-channel transistors MB3 and MB4. A source terminal of the transistor MB2 is connected to the ground potential. A gate terminal of the transistor MB2 is electrically connected to a gate terminal of the transistor MB1 of the differential amplifier DV. A drain terminal of the transistor MB2 has a feedback connection to the gate terminal of the transistor MB2 and is electrically connected to a drain terminal of the transistor MB3. A gate terminal of the transistor MB3 is electrically connected to a third input PD of the differential current evaluation circuit SBS (FIG. 5). The transistor MB4 is connected to the supply voltage potential $V_{DD}$ by its source terminal. A drain terminal of the transistor MB4 is electrically connected to the latter's gate terminal and to the source terminal of the transistor MB3. The gate terminal of the transistor MB4 is furthermore electrically connected to the gate terminals of the transistors MLP and MLN of the differential amplifier DV.

The circuit section SAP for setting the operating point of the differential amplifier DV has two electrical connections to the differential amplifier DV via the gate terminals of the transistors MB2 and MB4.

The circuit section STD for deactivating the differential current evaluation circuit SBS contains the two transistors MPD1 and MPD2, embodied as n-channel transistors in the exemplary embodiment. Furthermore, the circuit section STD has the p-channel transistor MPD3. The circuit section STD has, as a fourth transistor, the transistor MB3, which also belongs to the circuit section SAP. The transistors MPD1 and MPD2 are in each case electrically connected to the third input PD of the differential current evaluation circuit SBS by their gate terminals and are in each case electrically connected to ground potential by their source terminals. The transistor MPD1 is connected to the first output outp of the differential amplifier DV by its drain terminal and the transistor MPD2 is connected to the second output outn of the differential amplifier DV by its drain terminal. The transistor MPD3 is connected to supply voltage potential $V_{DD}$ by its source terminal and to a fourth input PDn of the differential current evaluation circuit SBS by its gate terminal. A drain terminal of the transistor MPD3 is electrically connected to the source terminal of the transistor MB3, to the gate terminal of the transistor MB4 and to the gate terminals of the transistors MLP and MLN. The circuit section STD for deactivating the differential current evaluation circuit SBS thus has an electrical connection to the first and to the second circuit branch SZW1 and SZW2 and the outputs outp and outn of the differential amplifier DV and also to the third and fourth inputs PD and PDn of the current evaluation circuit SBS.

In the exemplary embodiment, the circuit section STA for activating the differential current evaluation circuit SBS has four transistors, of which two transistors MPREn1 and MPREn2 are embodied as n-channel transistors. The other two transistors MPREp1 and MPREp2 are configured as p-channel transistors. The transistors MPREp1 and MPREp2 are connected to the gate terminal of the transistor MB4 and the gate terminals of the transistors MLP and MLN by their source terminals. The two transistors MPREp1 and MPREp2 are electrically connected to a fifth input PRECHn of the current evaluation circuit SBS by their gate terminals. The transistor MPREp1 is connected to the first output outp by its drain terminal. The transistor MPREp2 is electrically connected, by its drain terminal, to the second output outn of the differential amplifier DV or the differential current evaluation circuit SBS. The two transistors MPREn1 and MPREn2 are in each case connected to the supply voltage potential $V_{DD}$ by their drain terminals and to a sixth input PRECH of the differential current evaluation circuit SBS by their gate terminals. The transistor MPREn1 is connected to the first output outp of the differential current evaluation circuit SBS by its source terminal. The transistor MPREn2 is electrically connected to the second output outn of the differential current evaluation circuit SBS by its source terminal.

The method of operation of the differential amplifier DV illustrated in FIG. 6 with the corresponding additional circuitry through the circuit sections SAP, STD and STA is explained below. In order to switch off the differential amplifier DV or the differential current evaluation circuit SBS, illustrated in FIG. 6 without the two transistors MIN and MINB (FIG. 5), by way of example, a signal corresponding to the logic state "1" is applied to the input PD and an inverted signal with respect thereto is applied to the input PDn. By way of example, the signal applied to the input PD may be an operating voltage signal. As a result of such signals being applied to the inputs PD and PDn, the transistor MB3 turns off and interrupts the current flow through the transistors MB2 and MB4. Although the transistor MB4, by virtue of its feedback, turns itself off and also turns off the transistors MLP and MLN connected to its gate terminal, the transistor MPD3 additionally pulls the gate voltage of the transistor MB4, of the transistor MLP and of the transistor MLN toward the operating voltage. What is thereby achieved is that these transistors MB4, MLP and MLN turn off very rapidly. Furthermore, the outputs outp and outn of the differential amplifier are pulled to the ground potential by the transistors MPD1 and MPD2, as a result of which the connected input transistors MIN and MINB (not illustrated in FIG. 6) of the differential current evaluation circuit turn off. What can thereby be achieved is that, after this turn-off, current no longer flows through the data lines BL and BLB and, consequently, no static power loss occurs.

Figure 7:
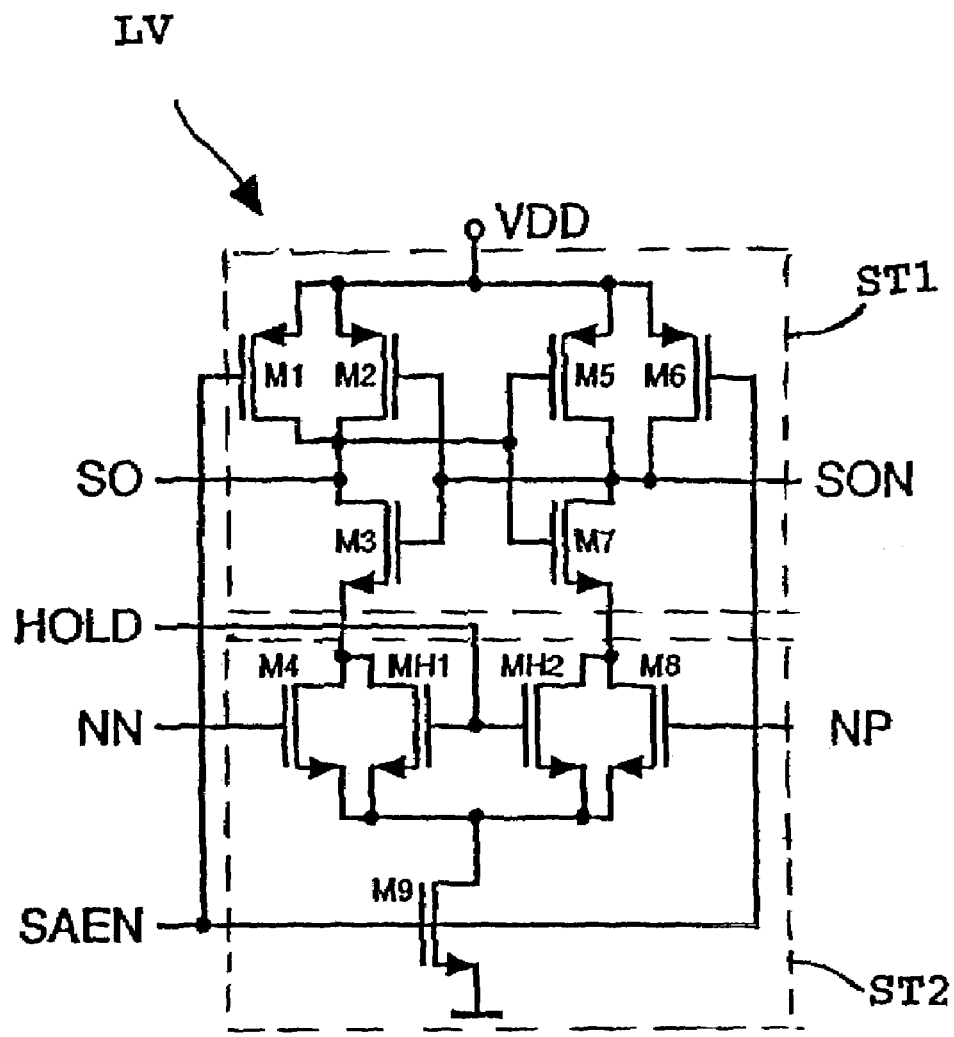
FIG. 7 is a circuit diagram of a sense amplifier circuit according to the invention.

In order to activate the differential current evaluation circuit SBS, the signal at the input PD is set to the logic state "0" and the signal at the input PDn is set to the logic state "1". In order to accelerate the activation operation, the transistor pair MPREp1 and MPREn1 is situated at the output outp and the transistor pair MPREp2 and MPREn2 is situated at the output outn. The four transistors MPREn1, MPREn2, MPREp1 and MPREp2 are switched on only for a short precharge phase. In this case, the signal at the input PRECH is set to a logic state "1" and the signal at the input PRECHn is set to the logic state "0". First, n-channel transistors MPREn1 and MPREn2 charge the outputs outp and outn very rapidly to the potential $V_{DD}-V_T$. The slower p-channel transistors MPREp1 and MPREp2 furthermore serve for a fine setting in that they charge the two outputs outp and outn to the gate voltage of the transistor MB4. What can thereby advantageously be achieved is that the outputs outp and outn are charged to a constant voltage value even in the case of large fluctuations in the precharge duration. In addition, significantly fewer disturbances of the output voltages result through the use of complementary transistors MPREn1, MPREp1 and MPREn2 and MPREp2 for precharging compared with a use of individual transistors during the turn-off of these transistors, since the charges flowing into the output node from the parasitic transistor capacitances largely compensate for one another. Through the additional circuit sections SAP, STD and STA, the input stage or the differential current evaluation circuit SBS can be switched off relatively rapidly immediately after the end of a read operation and be activated again very rapidly at the beginning of a read operation, as a result of which the power consumption of the differential current evaluation circuit SBS can be considerably reduced. The voltage $\Delta V$ present at the outputs outp and outn of the differential current evaluation circuit SBS, which voltage is proportional to the memory cell current $i_c$, can be evaluated by a sense amplifier connected downstream. By way of example, a sense amplifier circuit LV according to the invention, in accordance with FIG. 7, may be connected downstream of the differential current evaluation circuit SBS. The sense amplifier circuit LV has a first circuit section ST1, which corresponds in the way that it is connected up and in its construction to the first circuit section of the sense amplifier circuit disclosed in FIG. 2. A second circuit section ST2 of the sense amplifier circuit LV has a first circuit branch, in which the transistors M4 and MH1 are disposed, and a second circuit branch, in which the transistors M8 and MH2 are disposed. In the exemplary embodiment, the four transistors M4, M8, MH1 and MH2 are configured as n-channel transistors. The transistors M4 and MH1 are connected in parallel in the first circuit branch, the transistor M4 being electrically connected to a first input NN of the sense amplifier circuit LV by its gate terminal. The transistor MH1 is connected to a further input HOLD by its gate terminal. The two transistors M4 and MH1 are electrically connected to the source terminal of the transistor M3 of the first circuit section ST1 by their drain terminals and to the drain terminal of the transistor M9 by their source terminals. The transistor M8 in the second circuit branch is electrically connected to a second input NP of the sense amplifier circuit LV by its gate terminal. The transistor MH2 is electrically connected to the input HOLD by its gate terminal. The two transistors M8 and MH2 are electrically connected to the source terminal of the transistor M7 of the first circuit section ST1 by their drain terminals and to the drain terminal of the transistor M9 by their source terminals. The transistor M9 is connected to the input SAEN of the sense amplifier circuit LV by its gate terminal and is connected to ground potential by its source terminal.

If there is a signal present at the inputs NN and NP which corresponds, for example, to the voltage difference $\Delta V$ and is generated, for example, by the current evaluation circuit SBS connected upstream of the sense amplifier circuit LV, an evaluation of the signal is carried out in the sense amplifier circuit LV when an activation signal for starting an evaluation operation is present at the input SAEN. A corresponding output signal is thus generated at the two outputs SO and SON of the sense amplifier circuit LV. If the circuit configuration which is connected upstream of the sense amplifier circuit LV and generates the signal present at the inputs NN and NP, for example the current evaluation circuit SBS, is deactivated, the input transistors M4 and M8 turn off. In order that the sense amplifier circuit LV continues to make the information applied to its inputs NN and NP available at its outputs SO and SON even after the deactivation of the circuit configuration connected upstream, the two transistors MH1 and MH2 are activated by a signal at the input HOLD. As a result, the transistors M4 and M8 are bridged and the information read via the inputs NN and NP is made available to the outputs SO and SON even after the turn-off of the transistors M4 and M8.

Figure 8:
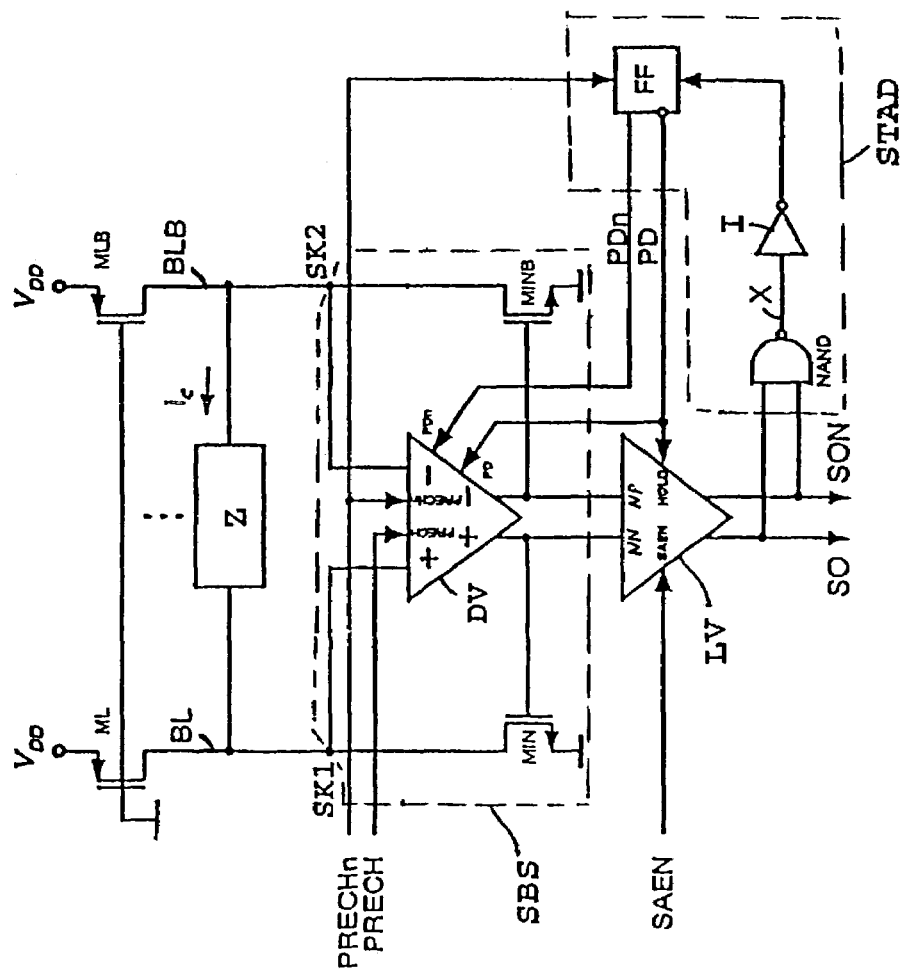
FIG. 8 is a circuit diagram of a circuit configuration according to the invention for reading out and evaluating a memory state of a semiconductor memory cell with automatic deactivation of the current evaluation circuit.

A circuit configuration according to the invention for reading out and evaluating a memory state in a semiconductor memory cell, in particular an SRAM memory cell, is illustrated in FIG. 8. The circuit configuration has an SRAM memory cell Z connected to the bit lines BL and BLB. The bit line BL is electrically connected to the circuit node SK1 and the bit line BLB is electrically connected to the circuit node SK2. Furthermore, the circuit configuration has the current evaluation circuit SBS and the sense amplifier circuit LV connected downstream of the current evaluation circuit SBS. In the exemplary embodiment in accordance with FIG. 8, the current evaluation circuit SBS is embodied as the differential current evaluation circuit SBS in accordance with the differential current evaluation circuit SBS according to the invention in FIG. 5. The differential amplifier DV is embodied in accordance with FIG. 6. In the exemplary embodiment in accordance with FIG. 8, the sense amplifier circuit LV is embodied according to the sense amplifier circuit LV according to the invention in FIG. 7. Furthermore, the circuit configuration has a circuit section STAD for activating and automatically deactivating the differential current evaluation circuit SBS. The circuit section STAD has a series circuit containing a NAND gate, an inverter I and a flip-flop FF, that is configured as an RS flip-flop in the exemplary embodiment. A first input of the NAND gate is electrically connected to the first output SO and a second input of the NAND gate is electrically connected to the second output SON of the sense amplifier circuit LV. The output signal of the inverter I is present at a first input of the flip-flop FF. The signal that is present, via the input PRECHn, at the corresponding input of the differential current evaluation circuit SBS is applied to a second input of the flip-flop FF. The flip-flop FF is electrically connected, by a first output, to the input PDn of the differential current evaluation circuit SBS or the differential amplifier DV. A second output PD of the flip-flop FF, which output is inverted with respect to the first output PDn, is electrically connected to the input PD of the differential amplifier DV and to the input HOLD of the sense amplifier circuit LV.

The method of operation of the activation and automatic deactivation of the differential current evaluation circuit SBS is explained below. A precharge signal is applied to the input PRECH of the differential current evaluation circuit SBS or the differential amplifier DV. The read operation starts when, by way of example, a rising edge of the precharge signal is detected. A complementary precharge signal is applied to the input PRECHn. Via the flip-flop FF, the signal at the output PD is set to the logic state "0" and the differential current evaluation circuit SBS is thereby activated. This activated state is preserved even after the subsequent deactivation of the precharge signal at the input PRECH (signal corresponding to the logic state "0"). Via a non-illustrated word line, the selected SRAM memory cell Z is connected to the bit line BLB and the current $i_c$ begins to flow, as a result of which, in the differential current evaluation circuit SBS, a voltage signal is converted in accordance with the voltage difference $\Delta V$. Through the application of an activation signal to the input SAEN of the sense amplifier circuit LV, the voltage signal is evaluated in accordance with the voltage difference $\Delta V$. Prior to the time of the activation via the input SAEN, the two outputs SO and SON of the sense amplifier circuit LV are charged to an operating voltage potential (logic state "1"). During the evaluation phase-in the sense amplifier circuit LV, one of the two outputs SO or SON is set to a logic state "0". The read operation is ended at the same time as the change in the logic state. The NAND gate connected to the outputs SO and SON switches from a logic state "0" to a logic state "1". The output signal X is applied to the inverter I connected downstream. The inverter I generates a corresponding output signal, as a result of which the output signal of the flip-flop FF at the output PD is set to the logic state "1" and the differential current evaluation circuit SBS is switched off. It may be provided that the activation and deactivation cycle is started anew by a corresponding signal at the input PRECH. The signal of the output PD is also applied to the input HOLD of the sense amplifier circuit LV. As a result, even after the automatic deactivation of the differential current evaluation circuit SBS, the information read is made available at the outputs SO and SON of the sense amplifier circuit LV. As already mentioned in the explanations with respect to FIG. 7, the transistors M4 and M8 (FIG. 7) connected to the inputs NN and NP of the sense amplifier circuit LV are bridged by the transistors MH1 and MH2 (FIG. 7) since these transistors M4 and M8 turn off because the output voltage of the differential current evaluation circuit SBS connected upstream is pulled to a voltage value 0 in order to switch off the transistors MIN and MINB.

Figure 9:
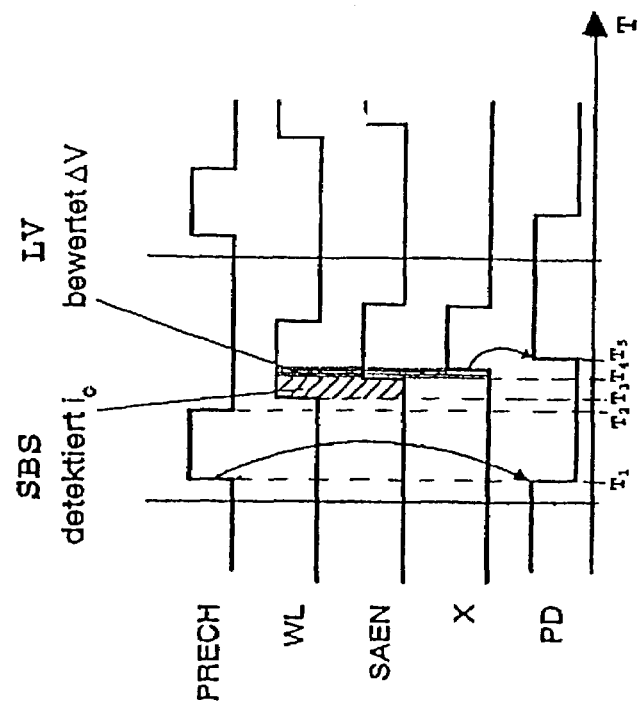
FIG. 9 is a timing diagram showing timing signals of the configuration of FIG. 8 according to the invention.

The temporal profile of the signals is illustrated in the function diagram in accordance with FIG. 9. At an instant $T_1$, the precharge signal at the input PRECH is set from the logic state "0" to the logic state "1" and the read operation is started. At the same time, the signal at the output PD of the flip-flop FF is set from the logic state "1" to the logic state "0". At an instant $T_2$, the precharge signal is set to the logic state "0" again. At an instant $T_3$, the word line signal WL is set from a logic state "0" to a logic state "1" and the memory cell Z is selected. The memory cell current $i_c$ through the differential current evaluation circuit SBS is detected in the time duration between the instants $T_3$ and $T_4$. At the instant $T_4$, the signal at the input SAEN of the sense amplifier LV is set from a logic state "0" to a logic state "1". Starting from the instant $T_4$, an evaluation of the signals present at the inputs NN and NP is carried out until one of the outputs SO and SON assumes a logic state "0". At this instant, the read operation or the evaluation phase is ended and the output signal X of the NAND gate (FIG. 8) is set from a logic state "0" to a logic state "1". The signal X is passed via the inverter I to the flip-flop FF and the signal at the output PD is set from the logic state "0" to the logic state "1" at an instant $T_5$.

Figure 6:
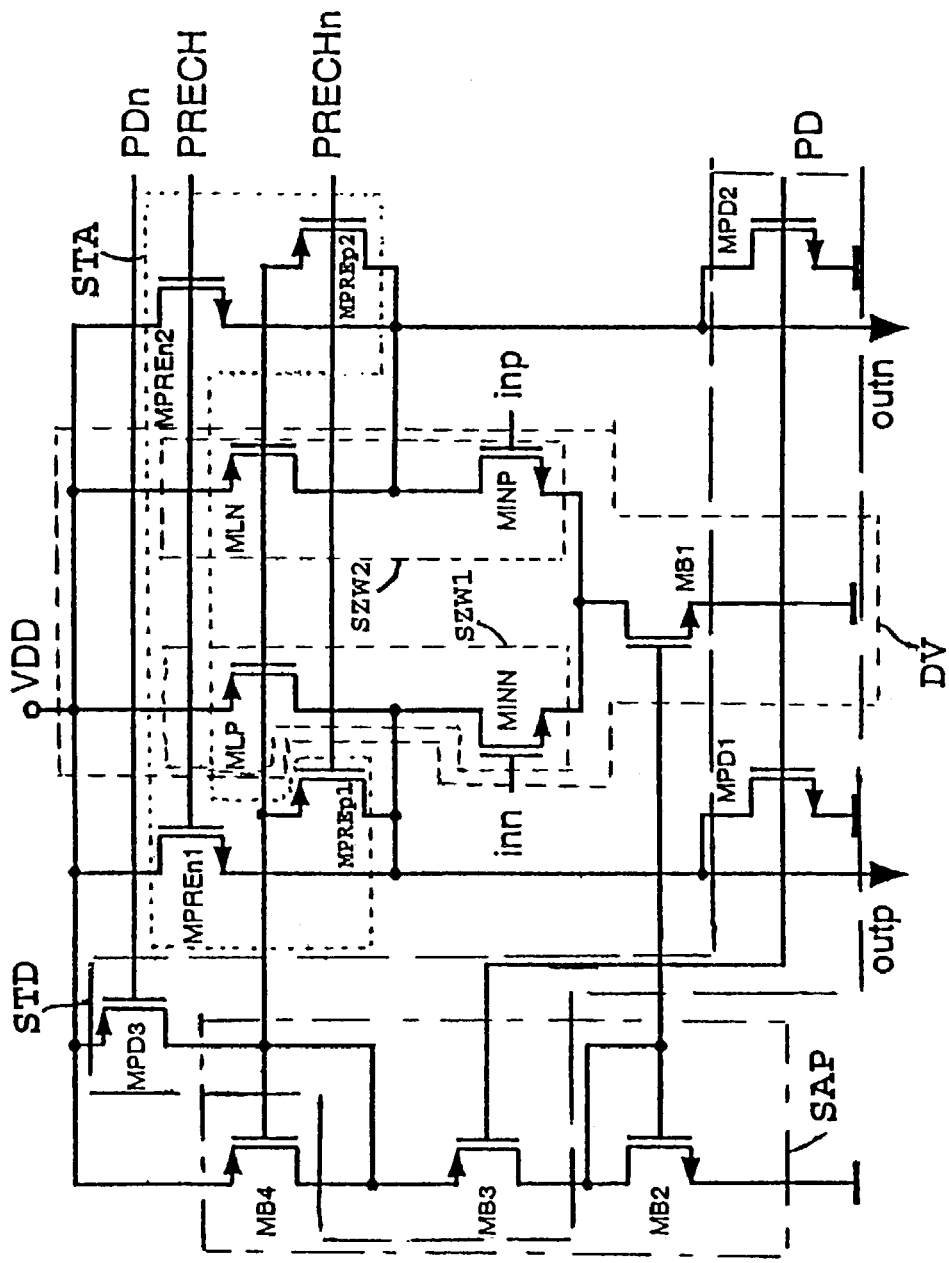
FIG. 6 is a circuit diagram of a partial region of the current evaluation circuit according to the invention.

It may also be provided that the circuit configuration for reading out and evaluating a memory state of the SRAM memory cell has a differential current evaluation circuit SBS according to the invention in accordance with FIG. 5, in particular with the differential amplifier DV which has an additional circuitry according to the illustration in FIG. 6, and is connected upstream of a sense amplifier LV known from the prior art, for example a sense amplifier LV in accordance with FIG. 2. Since this known sense amplifier circuit LV does not have an input HOLD, in this case the information read at the inputs cannot continue to be made available after the automatic deactivation of the differential current evaluation circuit SBS by the circuit section STAD. It is also possible to embody the differential amplifier DV in the differential current evaluation circuit SBS according to the invention without the circuit sections STA, STD and SAP. In this case, however, automatic deactivation cannot be carried out and the circuit section STAD is not necessary.

Figure 4:
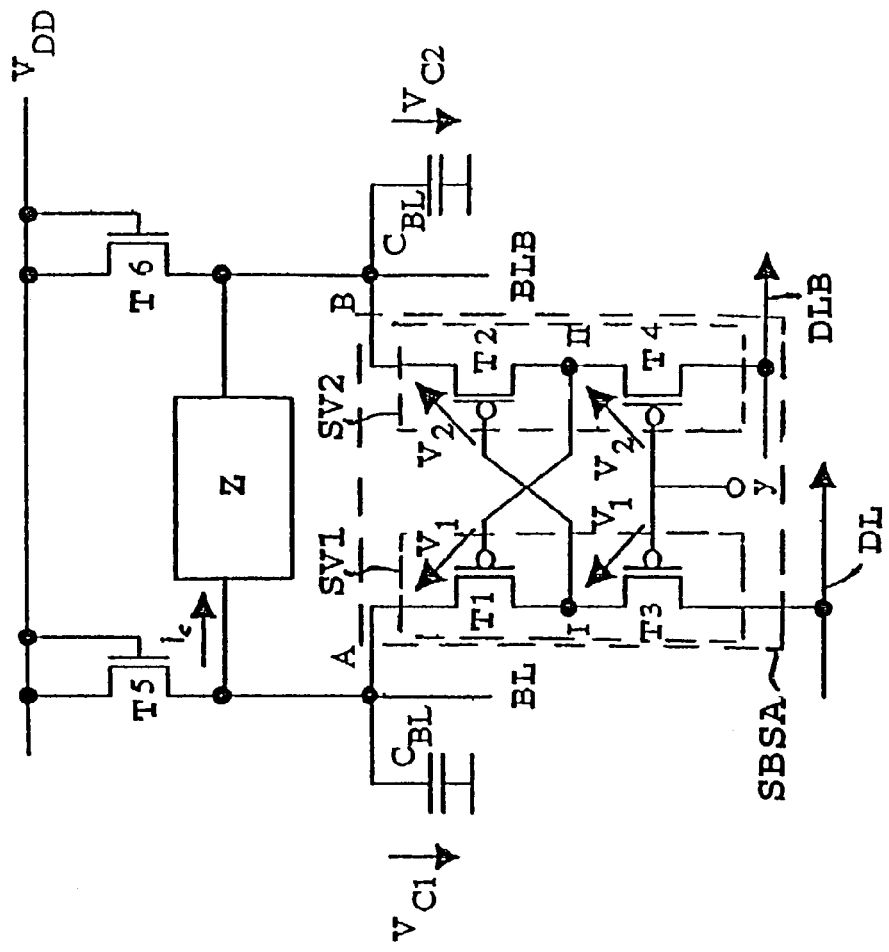
FIG. 4 is a circuit diagram of an embodiment of the current evaluation circuit according to the prior art.
Figure 3:
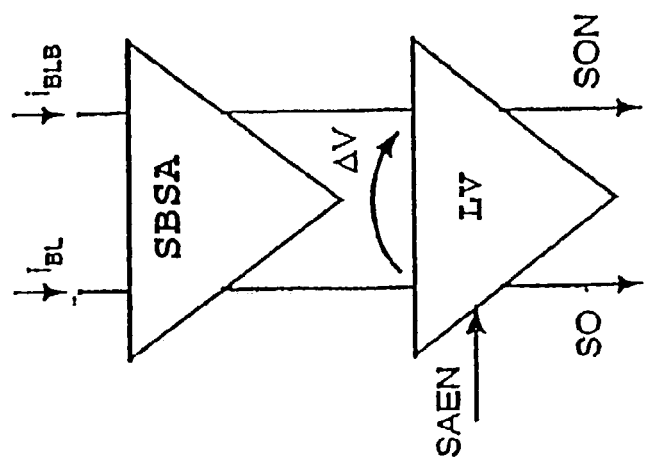
FIG. 3 is a circuit diagram of a series circuit containing a current evaluation circuit and a sense amplifier circuit according to the prior art.

A circuit configuration for reading out and evaluating a memory state of an SRAM memory cell may also be embodied in such a way that the circuit configuration has a current evaluation circuit known from the prior art, for example the current evaluation circuit SBS illustrated in FIG. 4. For the evaluation of the output signal of the current evaluation circuit, the circuit configuration may have a sense amplifier circuit LV according to the invention in accordance with FIG. 7. In this case, an automatic deactivation of the current evaluation circuit SBS and thus a connection of the circuit section STAD in the circuit configuration can be carried out only when the current evaluation circuit has, in particular, a circuit for deactivation.

Figure 11:
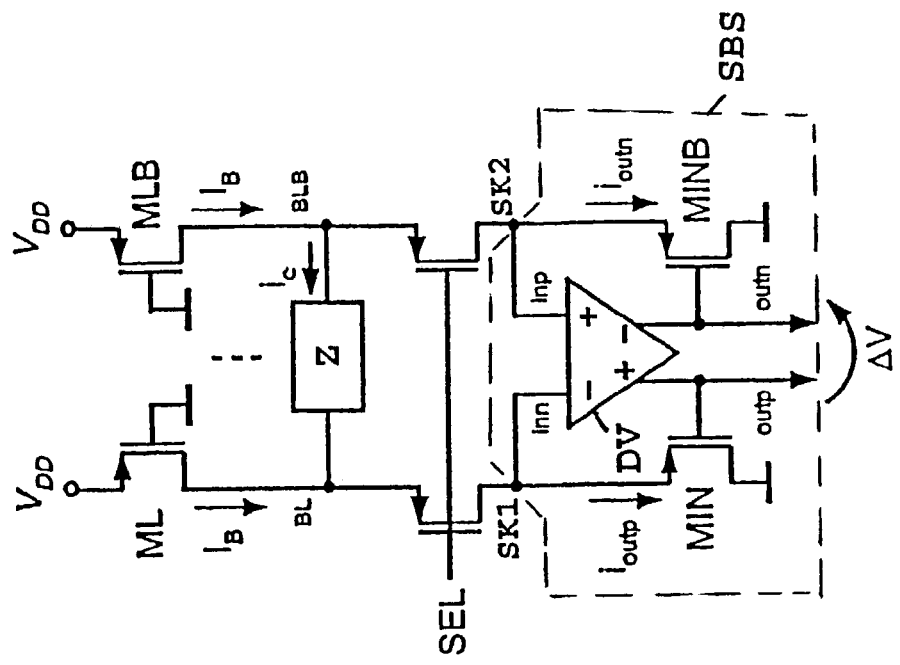
FIG. 11 is a circuit diagram of a third exemplary embodiment of circuitry of the current evaluation circuit according to the invention with memory cells connected upstream.
Figure 10:
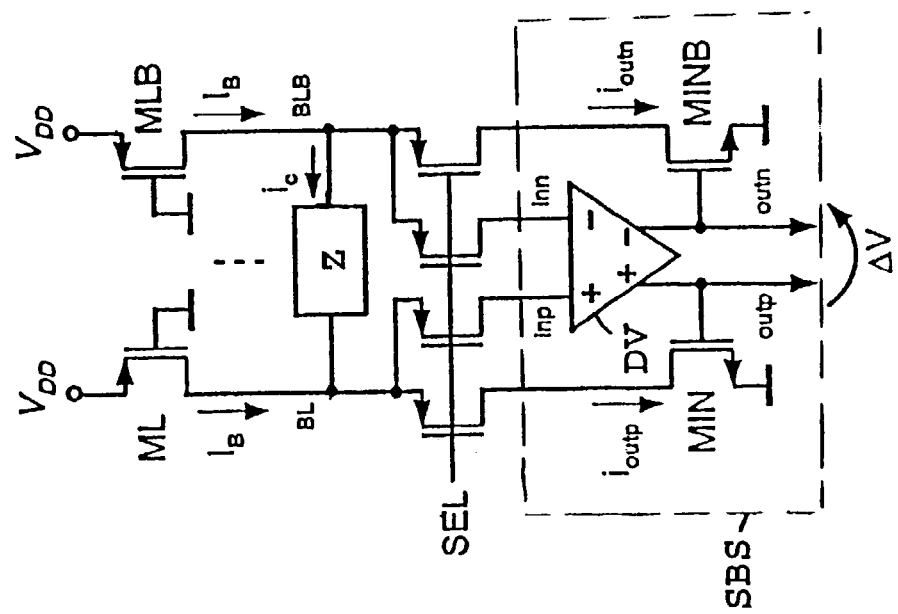
FIG. 10 is a circuit diagram of a second exemplary embodiment of the current evaluation circuit according to the invention with memory cells connected upstream.

Further exemplary embodiments which have an additional circuitry with a bit line multiplexer and a circuit for reducing the time duration during read access to the memory cell, which is increased in particular by the multiplexer circuit, are shown in FIGS. 10 and 11. The sense amplifier circuit LV is generally larger than the width of a memory cell Z. Therefore, the sense amplifier circuit LV is generally assigned a plurality of bit lines, each of which is switched to the sense amplifier circuit LV by a multiplexer circuit that, in principle, has a plurality of switches. The multiplexer circuit has a resistor connected in series with the input resistor of the sense amplifier circuit LV or the current evaluation circuit. The multiplexer circuit thus has a significant influence on the time behavior during read access to the memory cell. The circuit for reducing the time delay caused by the multiplexer circuit can reduce this time delay. Such a circuit configuration for reducing the time duration during read access to the memory is disclosed in Published, Non-Prosecuted German Patent Application DE 100 23 362 A1, corresponding to U.S. Pat. No. 6,466,500 B2 and U.S. Patent Application 2001043119 A1, which are hereby incorporated in their entirety in the disclosure content of this application.

FIG. 10 specifies a circuit in which the drain terminals of the transistors MIN and MINB and also the inputs inp and inn of the differential current evaluation circuit SBS are in each case electrically connected to a drain terminal of a p-channel transistor. The four transistors form a bit line multiplexer and are connected by their gate terminals to a circuit for reducing the time duration during read access to the memory cell Z or a memory cell array having a plurality of memory cells Z. The circuit for reducing the time delay during read access to the memory cell Z generates a signal SEL, through which the four transistors of the bit line multiplexer are controlled.

A further exemplary embodiment is shown in FIG. 11. In the exemplary embodiment, the multiplexer circuit is constructed from two p-channel transistors that are controlled by their gate terminals with the signal SEL. One of the two transistors is electrically connected to the circuit node SK1 by its drain terminal and the second transistor is electrically connected to the circuit node SK2 by its drain terminal.

In addition to the exemplary embodiments illustrated in the figures, it is furthermore possible to realize a plurality of further circuit configurations according to the invention for reading out and evaluating a memory state in a semiconductor memory cell, in particular an SRAM memory cell. An essential constituent part of such a circuit configuration may be the differential current evaluation circuit according to the invention. The differentially constructed current evaluation circuit has a differential amplifier whose outputs are electrically connected via a circuit for setting the input resistance of the differential amplifier to the inputs thereof and the signal lines between which a voltage difference is determined by the differential amplifier and a corresponding current is evaluated by the differential current evaluation circuit. This construction and the circuitry mean that the differential current evaluation circuit operates very rapidly and its requisite area requirement is relatively small. Particularly when using a differential current evaluation circuit for the read-out of an SRAM memory cell connected to the bit lines, a very fast evaluation is thus possible if a multiplicity of further memory cells are connected to the bit lines. Moreover, the differential amplifier or the differential current evaluation circuit may be supplemented in an inventive manner by circuit sections for setting the operating point of the differential amplifier and/or by a circuit section for deactivating the differential amplifier or the differential current evaluation circuit and/or a circuit section for activating the differential amplifier or the differential current evaluation circuit.

The voltage difference between two signal lines may also be detected directly by an inventive sense amplifier circuit whose inputs are connected to the two signal lines. In this case, a voltage difference corresponding to the current is not made available at the output of the sense amplifier circuit, rather the voltage occurring directly between the signal lines is made available as logic signal. By virtue of the circuitry of the sense amplifier circuit according to the invention, the detected voltage difference can be made available at the output in a temporally continuous manner, independently of whether or not the voltages on the two signal lines are set to 0. Preferably, the sense amplifier circuit is used in a circuit configuration for reading out and evaluating the memory state of a memory cell, no current evaluation circuit having to be connected upstream of the sense amplifier circuit in this case. As a result, it is possible to ensure a reliable and continuous further processing of the output signal of the sense amplifier circuit.

If a circuit configuration for reading out and evaluating a memory state of a semiconductor memory cell is constructed from an SRAM memory cell, a current evaluation circuit and a sense amplifier circuit, then one possible embodiment of an inventive circuit configuration is distinguished by the fact that the current evaluation circuit is configured in accordance with the differential current evaluation circuit according to the invention and is combined with a known sense amplifier circuit. The circuit configuration may advantageously be combined with a circuit section for automatically deactivating the current evaluation circuit. The use of such a circuit section for automatic deactivation results in a reduced power consumption of the circuit configuration, in particular of the current evaluation circuit, by the current evaluation circuit being operated in a temporally optimized manner and thus being activated directly before a read operation and being deactivated again directly after the end of the read operation.

A further possible inventive combination of such a circuit configuration results from a combination of a known current evaluation circuit with an inventive sense amplifier circuit connected downstream of the current evaluation circuit. Particularly when the current evaluation circuit is deactivated, a further processing of the output signal of the sense amplifier circuit is thus made possible even after a deactivation. This can be ensured since the sense amplifier circuit according to the invention still makes the information read available in the form of the output signal of the sense amplifier circuit even after the deactivation of the current evaluation circuit. In the case of this combination, too, it is particularly advantageous to extend the circuit configuration in an inventive manner by a circuit section for automatically deactivating the current evaluation circuit.

Through corresponding circuitry of the current evaluation circuit with the circuit section for automatically deactivating the current evaluation circuit, an automatic deactivation is possible in this case, too, the circuitry being able to be realized with a low outlay particularly when the current evaluation circuit has circuitry for deactivation.

The particularly preferred embodiment of the circuit configuration is distinguished by a combination of the differential current evaluation circuit according to the invention with the sense amplifier circuit according to the invention, since, with this combination, it is possible to minimize the time duration for the detection and evaluation of a memory state. The very low power consumption of this circuit configuration according to the invention can be reduced further in this case by an automatic deactivation of the differential current evaluation circuit being achieved by use of a low-outlay additional circuitry of the circuit configuration by use of the circuit section for automatic deactivation.

The inventive concept of the automatic deactivation of a current evaluation circuit by a suitable additional circuitry as is possible by the circuit section STAD can also be used in such a circuit configuration for reading out and evaluating a memory state in an SRAM memory cell in which neither the sense amplifier circuit nor the current evaluation circuit are configured in accordance with the sense amplifier circuit according to the invention or the current evaluation circuit according to the invention. In this case, the current evaluation circuit may have a circuit for deactivation or be deactivated by suitable circuitry of this current evaluation circuit with the circuit section STAD, as a result of which an optimized operating time or active time of the current evaluation circuit can also be achieved in known circuit configurations, in particular having an SRAM memory cell, a current evaluation circuit and a sense amplifier circuit. As a result, a significant reduction of the power consumption of the circuit configuration, in particular of the current evaluation circuit, is also possible.

In all the exemplary embodiments in which the concept of automatic deactivation is used, the automatic deactivation can advantageously ensure that a faulty behavior due to premature turn-off of the current evaluation circuit is also prevented, since the deactivation, in the case where the deactivation is carried out automatically, can only be effected if the sense amplifier connected downstream of the current evaluation circuit has ended the read operation.

Consequently, for the read-out and evaluation of a memory state of a memory cell, a plurality of inventive combinations for realizing a circuit configuration provided therefor are possible, which can in each case be supplemented by the inventive concept of automatic deactivation of, in particular, the current evaluation circuit.

We claim:

1. A differential current evaluation circuit for connecting to a data line pair having a first signal line and a second signal line, the differential current evaluation circuit comprising:
    a differential amplifier having a first output, a second output, a first input functioning as a first input of the differential current evaluation circuit and electrically connected to the first signal line of the data line pair, and a second input functioning as a second input of the differential current evaluation circuit and electrically connected to the second signal line of the data line pair; and
    a circuit for setting an input resistance of the differential current evaluation circuit, said circuit electrically connected to said first and second outputs and said first and second inputs of said differential amplifier and to the first and second signal lines of the data line pair, said circuit having two transistors of a first conductivity type, said two transistors including a first transistor electrically connected to said first output, said first input, and to the first signal line, and a second transistor electrically connected to said second output, said second input, and the second signal line, said first transistor having a gate terminal, a first terminal and a second terminal, said first transistor being electrically connected to said first output of said differential amplifier by said gate terminal, to the first signal line of the data line pair by said first terminal and to a ground potential by said second terminal, and said second transistor having a gate terminal, a first terminal and a second terminal, said second transistor being electrically connected to said second output of said differential amplifier by said gate terminal, to the second signal line of the data line pair by said first terminal and to the ground potential by said second terminal.

2. The differential current evaluation circuit according to claim 1, wherein said differential amplifier has two circuit branches connected in parallel, each of said two branches having a first transistor of a first conductivity type and a second transistor of a second conductivity type connected in series with said first transistor.

3. The differential current evaluation circuit according to claim 2, wherein:
    said two circuit branches include a first circuit branch and a second circuit branch;
    said first transistor of said first circuit branch has a gate terminal electrically connected to said second input of said differential amplifier; and
    said first transistor of said second circuit branch has a gate terminal electrically connected to said first input of said differential amplifier.

4. The differential current evaluation circuit according to claim 2, wherein said differential amplifier has a third transistor of said first conductivity type with a terminal connected in series said two circuit branches, said two circuit branches have first ends in each case receiving a supply voltage potential and second ends electrically connected to said terminal of said third transistor.

5. The differential current evaluation circuit according to claim 4, further comprising a circuit section for setting an operating point of said differential amplifier, said circuit section having at least two electrical connections to said differential amplifier.

6. A differential current evaluation circuit for connecting to a data line pair having a first signal line and a second signal line, the differential current evaluation circuit comprising:
    a differential amplifier having first output, a second output, a first input functioning as a first input of the differential current evaluation circuit and electrically connected to the first signal line of the data line pair, and a second input functioning as a second input of the differential current evaluation circuit and electrically connected to the second signal line of the data line pair, said differential amplifier having two circuit branches connected in parallel, each of said two branches having a first transistor of a first conductivity type and a second transistor of a second conductivity type connected in series with said first transistor, said differential amplifier having a third transistor of said first conductivity type with a terminal connected in series with said two circuit branches, said two circuit branches having first ends in each case receiving a supply voltage potential and second ends electrically connected to said terminal of said third transistor;
    a circuit for setting an input resistance of the differential current evaluation circuit, said circuit electrically connected to said first and second outputs and said first and second inputs of said differential amplifier and to the first and second signal lines of the data line pair; and
    a circuit section for setting an operating point of said differential amplifier, said circuit section having at least two electrical connections to said differential amplifier, said circuit section having a fourth transistor of said second conductivity type, said fourth transistor having a gate terminal electrically connected to said first and second circuit branches of said differential amplifier.

7. The differential current evaluation circuit according to claim 6, wherein:
    said third transistor has a gate terminal; and
    said circuit section for setting the operating point has a fifth transistor of said first conductivity type with a gate terminal electrically connected to said gate terminal of said third transistor, said third transistor connected in series with said two circuit branches of said differential amplifier.

8. The differential current evaluation circuit according to claim 7, further comprising a third input, and said circuit section for setting the operating point has a sixth transistor of said second conductivity type with a gate terminal electrically connected to said third input, a first terminal, and a second terminal.

9. The differential current evaluation circuit according to claim 8, wherein:
   said fifth transistor has a first terminal and a second terminal;
   said fourth transistor has a first terminal receiving a supply voltage potential, a gate terminal, and a second terminal connected to said gate terminal of said fourth transistor and also to said first terminal of said sixth transistor;
   said second terminal of said sixth transistor is electrically connected to said second terminal of said fifth transistor of said circuit section; and
   said fifth transistor has a feedback connection between said second terminal and said gate terminal of said fifth transistor and is connected to a ground potential by said first terminal of said fifth transistor.

10. The differential current evaluation circuit according to claim 9, further comprising:
    a fourth input; and
    a further circuit section for deactivating said differential amplifier, said further circuit circuit section being electrically connected at least to said first and second outputs of said differential amplifier, to said third input and to said fourth input.

11. The differential current evaluation circuit according to claim 10, wherein said further circuit section for deactivating said differential amplifier, includes:
    a seventh transistor of said first conductivity type connected to said first output of said differential amplifier and to said third input;
    at least one eighth transistor of said first conductivity type connected to said second output of said differential amplifier and to said third input;
    said sixth transistor, said gate terminal of said sixth transistor electrically connected to said third input; and
    a ninth transistor of said second conductivity type electrically connected to said fourth input.

12. The differential current evaluation circuit according to claim 11, wherein:
    said seventh and eighth transistors have gate terminals connected to said third input and first terminals connected to the ground potential;
    said seventh transistor has a second terminal electrically connected to said first output of said differential amplifier; and
    said eighth transistor has a second terminal electrically connected to said second output of said differential amplifier.

13. The differential current evaluation circuit according to claim 11, wherein said ninth transistor has a gate terminal connected to said fourth input, a first terminal receiving the supply voltage potential, and a second terminal connected to said two circuit branches of said differential amplifier.

14. The differential current evaluation circuit according to claim 13, wherein said circuit section and said further circuit section are connected up and share at least one common component which is used by both of said circuit section and said further circuit section, said common component being said sixth transistor.

15. The differential current evaluation circuit according to claim 14, further comprising:
    a fifth input;
    a sixth input; and
    an additional circuit section for activating said differential amplifier and electrically connected to said first and second outputs of said differential amplifier, to said fifth input and to said sixth input.

16. The differential current evaluation circuit according to claim 15, wherein said additional circuit section has a tenth transistor and an eleventh transistor each of said first conductivity type, said tenth transistor having a first terminal electrically connected to said first output of said differential amplifier, said eleventh transistor having a first terminal electrically connected to said second output of said differential amplifier, said tenth and eleventh transistors each having a second terminal receiving the supply voltage potential and a gate terminal connected to said fifth input.

17. The differential current evaluation circuit according to claim 16, wherein said additional circuit section has a twelve and thirteenth transistor each of said second conductivity type and each having a first terminal connected to said gate terminal of said fourth transistor for receiving a given voltage potential and a gate terminal connected to said sixth input, said twelve transistor having a second terminal electrically connected to said first output of said differential amplifier and said thirteenth transistor having a second terminal electrically connected to said second output of said differential amplifier.

18. The differential current evaluation circuit according to claim 6, wherein:
    said second transistor of said first and second circuit branches each has a gate terminal; and
    said gate terminal of said fourth transistor is electrically connected said gate terminal of said second transistor of said first circuit branch and to said gate terminal of said second transistor of said second circuit branch.

19. The differential current evaluation circuit according to claim 13, wherein:
    said second transistor has a gate terminal; and
    second terminal of said ninth transistor is connected to said gate terminal of said second transistor of said first and second circuit branches of said differential amplifier.

20. A circuit configuration for reading out and evaluating a memory state of a semiconductor memory cell, the semiconductor memory cell being electrically connected to a first data line of a data line pair by one terminal and to a second data line of the data line pair by a second terminal, the circuit configuration comprising:
    a differential current evaluation circuit, including:
       a differential amplifier having a first output, a second output, a first input functioning as a first input of the differential current evaluation circuit and electrically connected to the first signal line of the data line pair, and a second input functioning as a second input of the differential current evaluation circuit and electrically connected to the second signal line of the data line pair; and
       a circuit for setting an input resistance of the differential current evaluation circuit, said circuit being electrically connected to said first and second outputs and said first and second inputs of said differential amplifier and to the first and second signal lines of the data line pair; and
    a sense amplifier circuit connected downstream of said differential current evaluation circuit; said sense amplifier circuit, including:
       a first input;
       a first output;
       a second output;

a first circuit section having two cross-coupled inverters and a first of said inverters being electrically connected to said first output and a second of said inverters being electrically connected to said second output, each of said inverters having a first transistor of a given conductivity type and a second transistor of said given conductivity type being connected in parallel with said first transistor, said second transistor of each of said inverters having a gate terminal connected to said first input; and a second circuit section having two circuit branches including a first circuit branch and a second circuit branch, said first circuit branch electrically connected to said first inverter of said first circuit section and said second circuit branch being electrically connected to said second inverter of said first circuit section, said second circuit section having a third transistor having a first terminal electrically connected to a ground potential and a second terminal electrically connected to said first and second circuit branches, each of said two circuit branches having a fourth transistor and a fifth transistor connected in parallel with said fourth transistor.

21. The circuit configuration according to claim 20, further comprising:

a circuit section for automatically deactivating said differential current evaluation circuit after a read operation, said circuit section for automatic deactivation being electrically connected at least to one of said first and second outputs of said sense amplifier circuit and at least to one of said inputs of said differential evaluation circuit.

22. The circuit configuration according to claim 21, wherein:

said differential current evaluation circuit having a third input and a fourth input; and said circuit section for automatic deactivation is electrically connected to said third input and said fourth input of said differential current evaluation circuit.

23. The circuit configuration according to claim 22, wherein said circuit section for automatic deactivation has a series circuit containing a NAND gate, an inverter and a flip-flop.

24. The circuit configuration according to claim 23, wherein:

said sense amplifier circuit, includes:

a second input;

a third input;

a fourth input;

said fourth transistor of said first circuit branch has a gate terminal electrically connected to said second input;

said fifth transistor of said first circuit branch has a gate terminal connected to said third input;

said fourth transistor of said second circuit branch has a gate terminal connected to said fourth input; and said fifth transistor of said second circuit branch has a gate terminal electrically connected to said third input;

said NAND gate has inputs connected to said first and second outputs of said sense amplifier circuit; and said flip-flop has a first output electrically connected to said fourth input of said differential current evaluation circuit, a second output electrically connected to said third input of said differential current evaluation circuit and to said third input of said sense amplifier circuit.

25. The circuit configuration according to claim 21, wherein said circuit section for automatic deactivation has a series circuit containing a NAND gate, an inverter and a flip-flop.

26. The circuit configuration according to claim 24, wherein said inputs of said NAND gate are connected to said first and second outputs of said sense amplifier circuit and said flip-flop has at least one output which is electrically connected to said one of said inputs of said differential current evaluation circuit.

27. The circuit configuration according to claim 20, where the semiconductor memory cell is an SRAM memory cell.

* * * * *